US006292483B1

(12) United States Patent
Kerstein

(10) Patent No.: US 6,292,483 B1
(45) Date of Patent: *Sep. 18, 2001

(54) APPARATUS AND METHOD FOR GENERATING AN INDEX KEY FOR A NETWORK SWITCH ROUTING TABLE USING A PROGRAMMABLE HASH FUNCTION

(75) Inventor: Denise Kerstein, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/992,795

(22) Filed: Dec. 18, 1997

Related U.S. Application Data

(60) Provisional application No. 60/038,025, filed on Feb. 14, 1997.

(51) Int. Cl.[7] .............................. H04L 12/28; H04L 12/56

(52) U.S. Cl. ........................ 370/389; 370/392; 370/401

(58) Field of Search .................................. 370/389, 392, 370/400–405; 709/201, 232, 242, 243, 250

(56) References Cited

U.S. PATENT DOCUMENTS

| | | | | |
|---|---|---|---|---|
| 4,680,700 | * | 7/1987 | Hester et al. ........................ | 370/489 |
| 4,933,937 | * | 6/1990 | Konishi ................................ | 370/389 |
| 5,123,101 | | 6/1992 | Sindhu ................................ | 711/207 |
| 5,247,620 | * | 9/1993 | Fukuzawa et al. .................. | 370/389 |
| 5,515,376 | | 5/1996 | Murthy et al. ...................... | 370/468 |
| 5,633,858 | * | 5/1997 | Chang et al. ....................... | 370/392 |
| 5,649,109 | * | 7/1997 | Griesmer et al. ................... | 370/389 |
| 5,740,171 | * | 4/1998 | Mazzola et al. .................... | 370/392 |
| 5,757,795 | * | 5/1998 | Schnell ............................... | 370/392 |
| 5,802,054 | * | 9/1998 | Bellenger .......................... | 370/401 |
| 5,842,224 | * | 11/1998 | Fenner ............................... | 370/392 |
| 5,852,607 | * | 12/1998 | Chin ................................... | 370/392 |
| 5,914,938 | * | 6/1999 | Brady et al. ....................... | 370/401 |
| 5,923,660 | * | 7/1999 | Shema et al. ...................... | 370/402 |
| 5,949,786 | * | 9/1999 | Bellenger .......................... | 370/401 |
| 6,084,877 | * | 7/2000 | Egbert et al. ...................... | 370/389 |

FOREIGN PATENT DOCUMENTS 0 600 683 A3    6/1994   (EP) .

OTHER PUBLICATIONS

"A Comparison of Hashing Schemes for Address Lookup in Computer Networks", Raj Jain, IEEE Transactions on Communications, vol. 40, No. 10, Oct. 1992, pp. 1570–1573.

* cited by examiner

*Primary Examiner*—Chau Nguyen
*Assistant Examiner*—Phuongchau Ba Nguyen

(57) ABSTRACT

A network switch configured for switching data packets across multiple switch ports uses programmable hash functions to generate a hash key for each network address to access an address table storing switching logic. The address table is configured to include a programmable number of bin entries, where each bin entry is configured to reference a plurality of address table entries storing the switching logic information for respective network addresses. The address of an incoming data packet is used to generate a hash key that references a selected one of the bin entries. The switching logic for the corresponding address is then obtained by accessing the appropriate table entry referenced by the selected bin entry. If the number of table entries for a given bin exceeds a prescribed threshold, an external host reprograms the network switch to use another hash key to maintain an efficient access throughput of the address table. Use of programmable hash keys also enables the host processor to use different hash key polynomials for different network configurations to optimize the table access throughput.

20 Claims, 7 Drawing Sheets

APPARATUS AND METHOD FOR GENERATING AN INDEX KEY FOR A NETWORK SWITCH ROUTING TABLE USING A PROGRAMMABLE HASH FUNCTION

RELATED APPLICATIONS

This application claims priority from provisional patent application Ser. No. 60/038,025, filed Feb. 14, 1997, entitled INTEGRATED MULTIPORT SWITCH, which is incorporated herein by reference.

BACKGROUND ART

Switched local area networks use a network switch for supplying data frames between network stations, where each network station is connected to the network switch by a media. The switched local area network architecture uses a media access control (MAC) enabling a network interface within each network node (including the switch) to access the media.

The network switch passes data frames received from a transmitting station to a destination station based on the header information in the received data frame, including source address and destination address. One possible arrangement for generating a frame forwarding decision may use the source address or destination address in a direct addressing scheme, where the network switch includes a table storing switching logic for a plurality of network addresses, and where the switching logic for the corresponding destination address is stored in a table address corresponding to the destination address. Such an arrangement, however, is not practical for a network where the source addresses or destination addresses may have a large variation in values. Moreover, it may be more difficult for the network switch to quickly scan a table for the referenced address, locate the address, and make a frame forwarding decision as the table grows with table entries storing address information, especially if the address information is stored in a sequential manner. Since multiple data frames may be received by the network switch simultaneously, the network switch needs to make frame forwarding decisions relatively quickly. Hence, storing address information in a sequential manner (i.e., arranged in an increasing order by either source address or destination address) becomes impracticable as the number of entries increases, since a row by row search for the appropriate address table entry may be too slow for making frame forwarding decisions for multiple received data frames.

One arrangement for improving the accessing of switching logic from a table involves hashing, where an address, such as the source address or destination address, is transformed into a key that will be used to access information from a table. A problem with using a hash function is that the hash function is permanently set in the network switch. Hence, network traffic over time may cause over-usage of certain entries in the address table of the network switch. Hence, the over-usage results in a loss of efficiency in accessing the appropriate address table entry, causing the switching engine in the network switch to suffer a loss of performance in the throughput in making frame forwarding decisions.

SUMMARY OF THE INVENTION

There is a need for an arrangement for accessing a table entry storing switching logic in a network switch that maintains a high throughput, regardless of the accumulation of table entries over time.

There is also a need for an arrangement for generating an index key for accessing a table entry using a hashing function, where the distribution of incoming network addresses over an address range is balanced to limit access time.

These and other needs are attained by the present invention, where the network switch includes a programmable hash function register, enabling the hash function to be selectively modified during network operation to maintain an even distribution of entries within a table.

According to one aspect of the present invention, a method for determining a network switch output port for transmission of a data packet having an address and having been received by a network switch comprises storing a user-selected hash function in a programmable register, generating a hash key for the received data packet in response to the user-selected hash function and the corresponding address, accessing a selected bin entry from a plurality of bin entries in an address table based on the hash key, each bin entry configured to reference a corresponding plurality of table entries, each table entry configured for identifying the output port for a corresponding address, and determining the output port from one of the table entries of the selected bin entry based on the address. Use of a hash key to access a table entry for a corresponding address enables efficient allocation of table entries across the plurality of bin entries. Moreover, storing the user-selected hash function in a programmable register enables the hash key, and subsequently the address table bin structure, to be reconfigured upon a determination that a given bin entry has a number of table entries exceeding a prescribed value. Hence, the method enables efficient accessing of switching logic for a given address, where the hash key and the bin structure of the address table can be periodically modified to maintain an efficient address search structure, enabling the network switch to make frame forwarding decisions quickly for multiple received data packets.

Another aspect of the present invention provides a method for controlling access of a network address table storing switching logic for a plurality of network addresses, comprising storing a first number in a first programmable register, the first number specifying an addressable range of bin entries in the address table, each bin entry configured to reference a corresponding group of table entries for respective network addresses, storing a second number specifying a user-specified hash function in a second programmable register, the hash function configured to map a network address value to one of the bin entries, monitoring for at least one bin entry a number of the corresponding table entries, and replacing the second number in the second programmable register with a third number specifying a second user-specified hash function in response to the number of table entries exceeding a prescribed threshold. Monitoring the number of table entries for a bin entry ensures that the address table maintains an efficient distribution of entries, since replacement of the user-specified hash function essentially resets the table entry distribution before loss in address table access performance is encountered.

Still another aspect of the present invention provides a network switch configured for outputting a data packet having an address, comprising a first programmable register for storing a first number specifying an addressable range of bin entries, a network address table for storing the addressable range of bin entries, each bin entry configured to reference at least one table entry and each table entry configured for storing switching data including an output port of the network switch for a corresponding address, a second programmable register for storing a second number specifying a user-specified hash function, and a hash key generator configured to map the address of the data packet to one of the bin entries according to the user-specified hash function specified by the second number, the hash key generator outputting a hash key for addressing the one bin entry and having a number of bits based on the first number. The programmable registers ensure that a network address table can be configured for optimum access for different network architectures and addressing schemes.

Another aspect of the present invention provides a system comprising a network switch configured for outputting a data packet having an address, comprising a first programmable register for storing a first number specifying an addressable range of bin entries, a network address table for storing the addressable range of bin entries, each bin entry configured to reference at least one table entry and each table entry configured for storing switching data including an output port of the network switch for a corresponding address, a second programmable register for storing a second number specifying a user-specified hash function, and a hash key generator configured to map the address of the data packet to one of the bin entries according to the user-specified hash function specified by the second number, the hash key generator outputting a hash key for addressing the one bin entry and having a number of bits based on the first number, and a host processor configured for monitoring for at least one bin entry a number of the corresponding table entries, the host processor selectively reprogramming the second programmable register with a second number specifying another user-specified hash function in response to the number of table entries exceeding a prescribed threshold.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout and wherein.

DETAILED DESCRIPTION OF ILLUSTRATED EMBODIMENTS

The present invention will be described with the example of a switch in a packet switched network, such as an Ethernet (IEEE 802.3) network. A description will first be given of the switch architecture, followed by the arrangement for controlling access of a network address table using programmable hash keys according to the present invention. It will become apparent, however, that the present invention is also applicable to other packet switched systems, as described in detail below.

Swich Architecture

Figure 1:
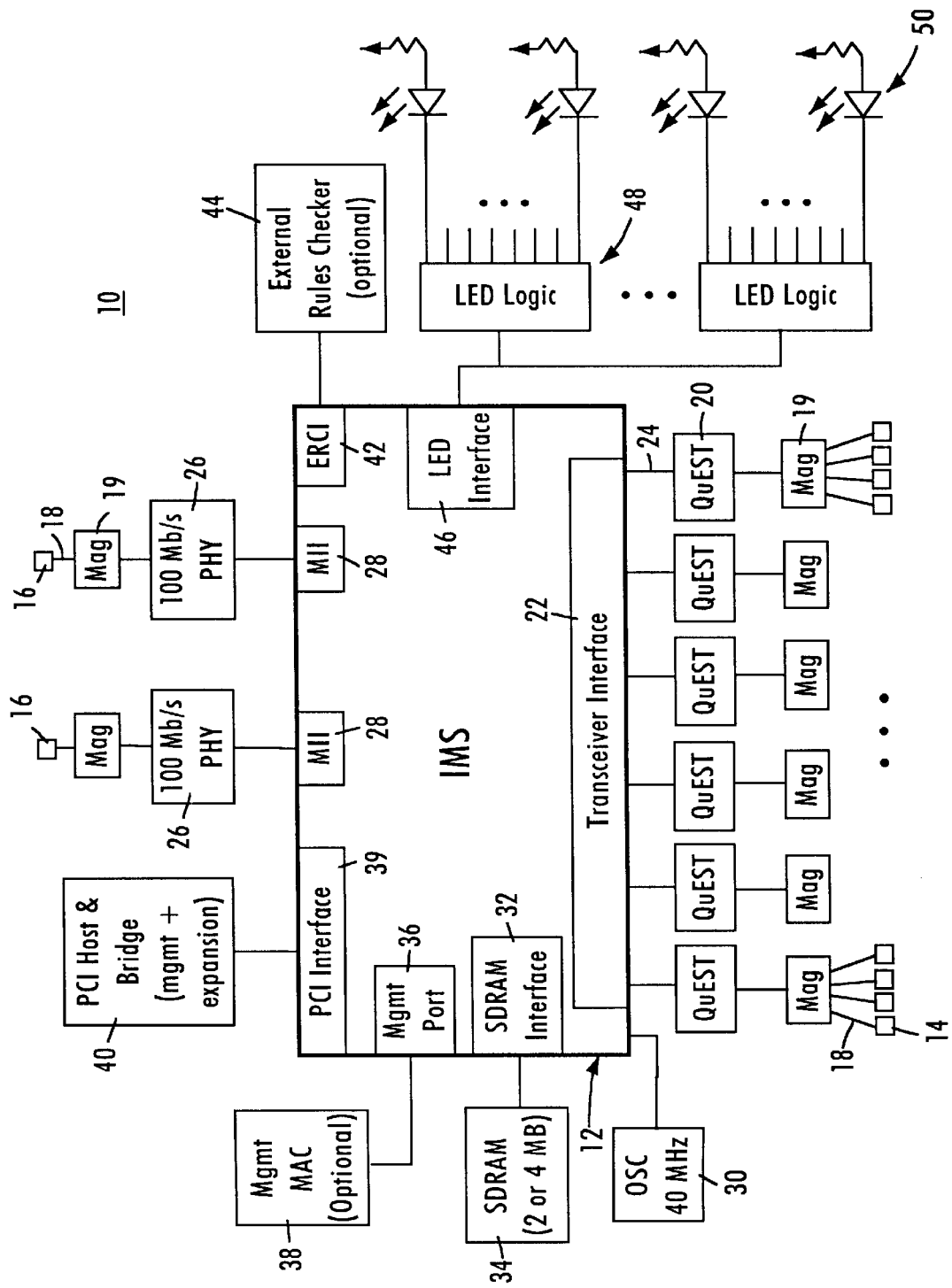
FIG. 1 is a block diagram of a packet switched system constructed in accordance with an embodiment of the present invention.

FIG. 1 is a block diagram of an exemplary system in which the present invention may be advantageously employed. The exemplary system 10 is a packet switched network, such as an Ethernet network. The packet switched network includes an integrated multiport switch (IMS) 12 that enables communication of data packets between network stations. The network may include network stations having different configurations, for example twenty-four (24) 10 megabit per second (Mb/s) network stations 14 that send and receive data at a network data rate of 10 Mb/s, and two 100 Mb/s network stations 16 that send and receive data packets at a network speed of 100 Mb/s. The multiport switch 12 selectively forwards data packets received from the network stations 14 or 16 to the appropriate destination based upon Ethernet protocol.

According to the disclosed embodiment, the 10 Mb/s network stations 14 send and receive data packets to and from the multiport switch 12 via a media 18 and according to half-duplex Ethernet protocol. The Ethernet protocol ISO/IEC 8802-3 (ANSI/IEEE Std. 802.3, 1993 Ed.) defines a half-duplex media access mechanism that permits all stations 14 to access the network channel with equality. Traffic in a half-duplex environment is not distinguished or prioritized over the medium 18. Rather, each station 14 includes an Ethernet interface card that uses carrier-sense multiple access with collision detection (CSMA/CD) to listen for traffic on the media. The absence of network traffic is detected by sensing a deassertion of a receive carrier on the media. Any station 14 having data to send will attempt to access the channel by waiting a predetermined time after the deassertion of a receive carrier on the media, known as the interpacket gap interval (IPG). If a plurality of stations 14 have data to send on the network, each of the stations will attempt to transmit in response to the sensed deassertion of the receive carrier on the media and after the IPG interval, resulting in a collision. Hence, the transmitting station will monitor the media to determine if there has been a collision due to another station sending data at the same time. If a collision is detected, both stations stop, wait a random amount of time, and retry transmission. If desired, the 10 Mb/s network stations may also be configured to operate in full-duplex mode.

The 100 Mb/s network stations 16 preferably operate in full-duplex mode according to the proposed Ethernet standard IEEE 802.3x Full-Duplex with Flow Control—Working Draft (0.3). The full-duplex environment provides a two-way, point-to-point communication link between each 100 Mb/s network station 16 and the multiport switch 12, where the multiport switch 12 and the respective stations 16 can simultaneously transmit and receive data packets without collisions. The 100 Mb/s network stations 16 each are coupled to network media 18 via 100 Mb/s physical (PHY) devices 26 of type 100 Base-TX, 100 Base-T4, or 100 Base-FX. The multiport switch 12 includes a media independent interface (MII) 28 that provides a connection to the physical devices 26. The 100 Mb/s network stations 16 may be implemented as servers or routers for connection to other networks. The 100 Mb/s network stations 16 may also operate in half-duplex mode, if desired. Similarly, the 10 Mb/s network stations 14 may be modified to operate according to full-duplex protocol with flow control.

As shown in FIG. 1, the network 10 includes a series of switch transceivers 20 that perform time division multiplexing and time division demultiplexing for data packets transmitted between the multiport switch 12 and the 10 Mb/s stations 14. A magnetic transformer module 19 maintains the signal waveform shapes on the media 18. The multiport switch 12 includes a transceiver interface 22 that transmits and receives data packets to and from each switch transceiver 20 using a time-division multiplexed protocol across a single serial non-return to zero (NRZ) interface 24. The switch transceiver 20 receives packets from the serial NRZ interface 24, demultiplexes the received packets, and outputs the packets to the appropriate end station 14 via the network media 18. According to the disclosed embodiment, each switch transceiver 20 has four independent 10 Mb/s twisted-pair ports and uses 4:1 multiplexing across the serial NRZ interface enabling a four-fold reduction in the number of pins required by the multiport switch 12.

The multiport switch 12 contains a decision making engine, switching engine, buffer memory interface, configuration/control/status registers, management counters, and MAC (media access control) protocol interface to support the routing of data packets between the Ethernet ports serving the network stations 14 and 16. The multiport switch 12 also includes enhanced functionality to make intelligent switching decisions, and to provide statistical network information in the form of management information base (MIB) objects to an external management entity, described below. The multiport switch 12 also includes interfaces to enable external storage of packet data and switching logic in order to minimize the chip size of the multiport switch 12. For example, the multiport switch 12 includes a synchronous dynamic RAM (SDRAM) interface 32 that provides access to an external memory 34 for storage of received frame data, memory structures, and MIB counter information. The memory 34 may be an 80, 100 or 120 MHz synchronous DRAM having a memory size of 2 or 4 Mb.

The multiport switch 12 also includes a management port 36 that enables an external management entity to control overall operations of the multiport switch 12 by a management MAC interface 38. The management port 36 outputs management frames having at least a portion of a selected received data packet and new information providing management information. The multiport switch 12 also includes a PCI interface 39 enabling access by the management entity via a PCI host and bridge 40. Alternatively, the PCI host and bridge 40 may serve as an expansion bus for a plurality of multiport switch devices 12.

The multiport switch 12 includes an internal decision making engine that selectively transmits data packets received from one source to at least one destination station. The internal decision making engine may be substituted with an external rules checker. The multiport switch 12 includes an external rules checker interface (ERCI) 42 that allows use of an external rules checker 44 to make frame forwarding decisions in place of the internal decision making engine. Hence, frame forwarding decisions can be made either by the internal switching engine or the external rules checker 44.

The multiport switch 12 also includes an LED interface 46 that clocks out the status of conditions per port and drives LED external logic 48. The LED external logic 48, in turn, drives LED display elements 50 that are human readable. An oscillator 48 provides a 40 MHz clock input for the system functions of the multiport switch 12.

Figure 2:
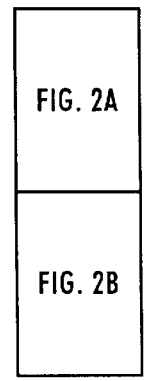
FIG. 2 is a block diagram of a multiport switch constructed in accordance with an embodiment of the present invention and used in the packet switched system of FIG. 1.
Figure 2A:
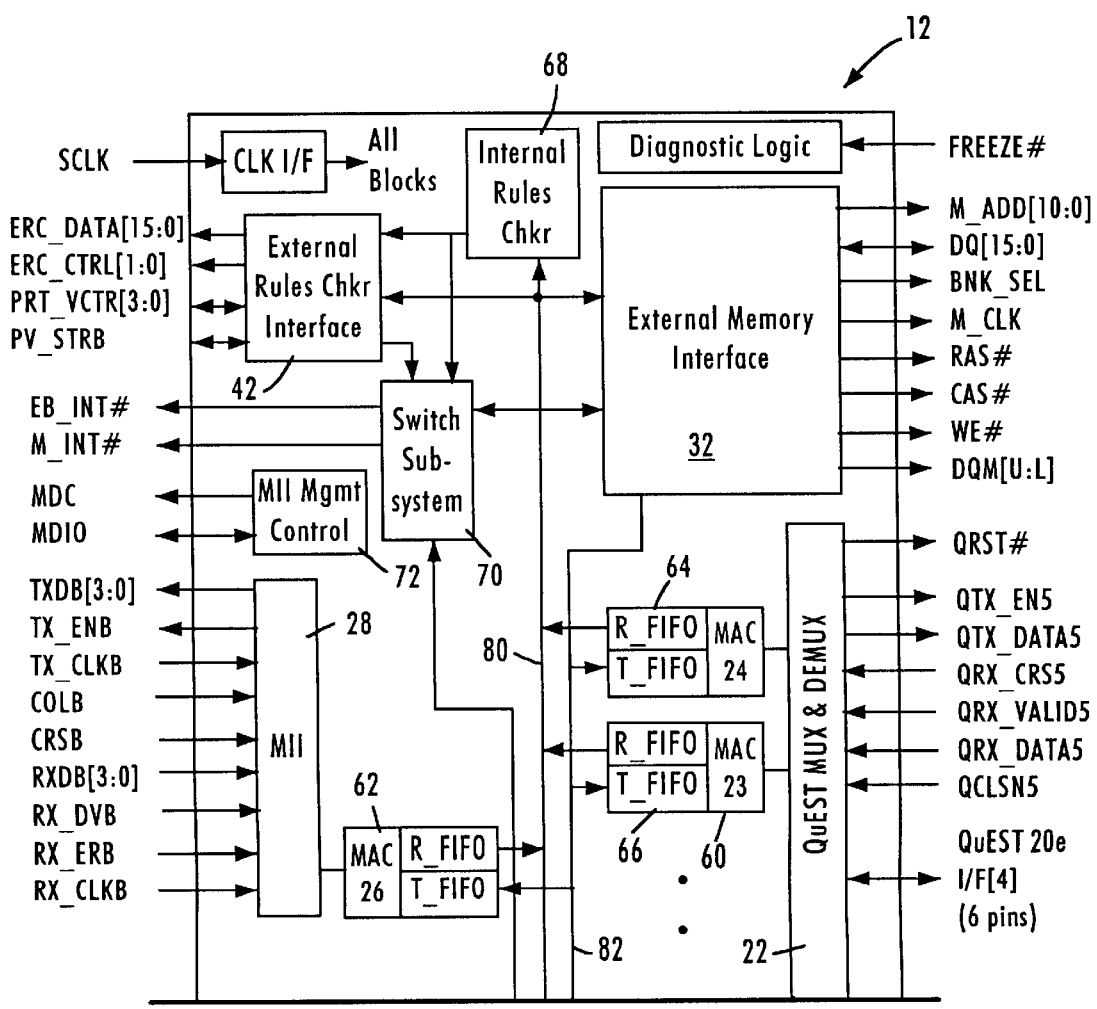
Figure 2B:
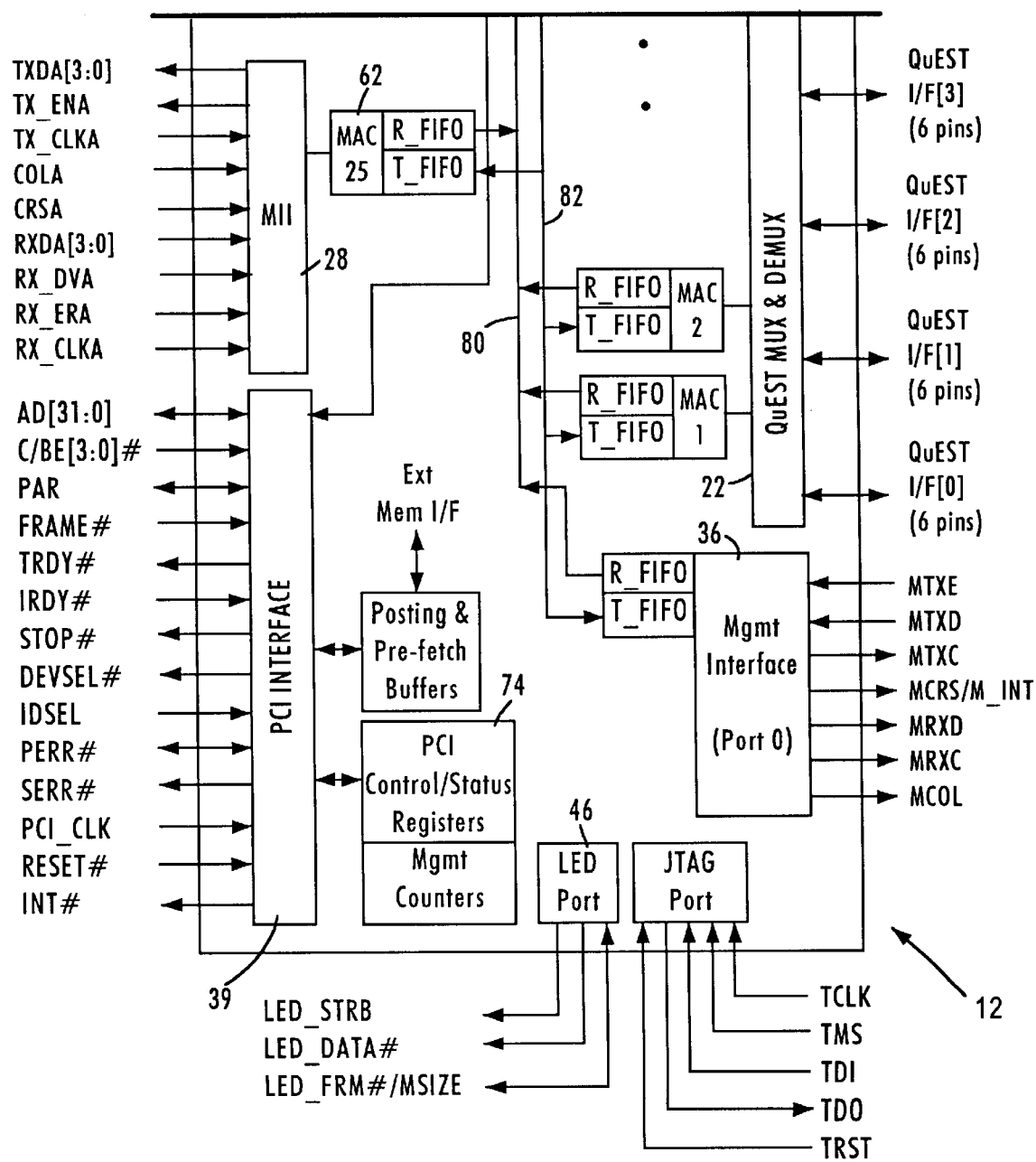

FIG. 2 is a block diagram of the multiport switch 12 of FIG. 1. The multiport switch 12 includes twenty-four (24) 10 Mb/s media access control (MAC) ports 60 for sending and receiving data packets in half-duplex between the respective 10 Mb/s network stations 14 (ports 1–24), and two 100 Mb/s MAC ports 62 for sending and receiving data packets in full-duplex between the respective 100 Mb/s network stations 16 (ports 25, 26). As described above, the management interface 36 also operates according to MAC layer protocol (port 0). Each of the MAC ports 60, 62 and 36 has a receive first in-first out (FIFO) buffer 64 and transmit FIFO 66. Data packets from a network station are received by the corresponding MAC port and stored in the corresponding receive FIFO 64. The received data packet is output from the corresponding receive FIFO 64 to the external memory interface 32 for storage in the external memory 34.

The header of the received packet is also forwarded to a decision making engine, comprising an internal rules checker 68 and an external rules checker interface 42, to determine which MAC ports will output the data packet. Specifically, the packet header is forwarded to an internal rules checker 68 or the external rules checker interface 42, depending on whether the multiport switch 12 is configured to operate using the internal rules checker 68 or the external rules checker 44. The internal rules checker 68 and external rules checker 44 provide the decision making logic for determining the destination MAC port for a given data packet. The decision making engine may thus output a given data packet to either a single port, multiple ports, or all ports (i.e., broadcast). For example, each data packet includes a header having source and destination address, where the decision making engine may identify the appropriate output MAC port based upon the destination address. Alternatively, the destination address may correspond to a virtual address that the appropriate decision making engine identifies as corresponding to a plurality of network stations. Alternatively, the received data packet may include a VLAN (virtual LAN) tagged frame according to IEEE 802.1d protocol that specifies another network (via a router at one of the 100 Mb/s stations 16) or a prescribed group of stations. Hence, either the internal rules checker 68 or the external rules checker 44 via the interface 42 will decide whether a frame temporarily stored in the buffer memory 34 should be output to a single MAC port or multiple MAC ports.

Use of the external rules checker 44 provides advantages such as increased capacity, a random-based ordering in the decision queue that enables frame forwarding decisions to be made before the frame is completely buffered to external memory, and enables decisions to be made in an order independent from the order in which the frames were received by the multiport switch 12.

The decision making engine (i.e., internal rules checker 68 or the external rules checker 44) outputs a forwarding decision to a switch subsystem 70 in the form of a port vector identifying each MAC port that should receive the data packet. The port vector from the appropriate rules checker includes the address location storing the data packet in the external memory 34, and the identification of the MAC ports to receive the data packet for transmission (e.g., MAC ports 0–26). The switch subsystem 70 fetches the data packet identified in the port vector from the external memory 34 via the external memory interface 32, and supplies the retrieved data packet to the appropriate transmit FIFO 66 of the identified ports.

Additional interfaces provide management and control information. For example, a management data interface 72 enables the multiport switch 12 to exchange control and status information with the switch transceivers 20 and the 100 Mb/s physical devices 26 according to the MII management specification (IEEE 802.3u). For example, the management data interface 72 outputs a management data clock (MDC) providing a timing reference on the bidirectional management data IO (MDIO) signal path.

The PCI interface 39 is a 32-bit PCI revision 2.1 compliant slave interface for access by the PCI host processor 40 to internal IMS status and configuration registers 74, and access external memory SDRAM 34. The PCI interface 39 can also serve as an expansion bus for multiple IMS devices. The management port 36 interfaces to an external MAC engine through a standard seven-wire inverted serial GPSI interface, enabling a host controller access to the multiport switch 12 via a standard MAC layer protocol.

Programmable Hash Keys

Figure 3:
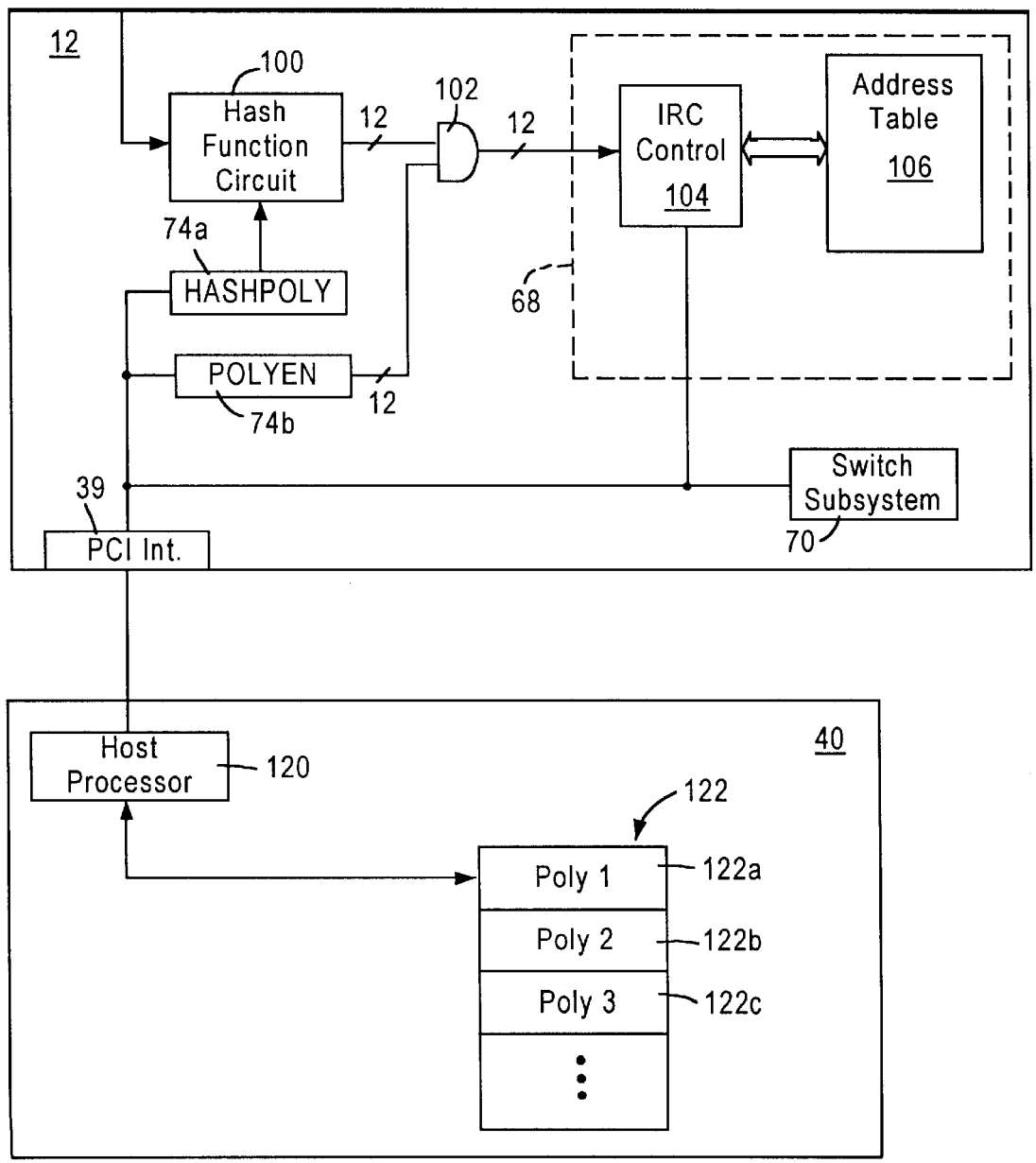
FIG. 3 is a block diagram of a system including the multiport switch of FIG. 2 using programmable hash functions according to an embodiment of the present invention.

FIG. 3 is as block diagram illustrating in detail the functional components of the multiport switch 12 and the host 40 associated with controlling access of a network address table using programmable hash keys according to an embodiment of the present invention. As described above, the multiport switch 12 needs to make frame forwarding decisions relatively quickly, since multiple data frames may be received by the multiport switch 12 simultaneously. Hence, the disclosed embodiment uses a hashing scheme, where the address information from the header of a received data packet is processed using a hashing function, described below, to obtain index information. As shown in FIG. 3, the multiport switch 12 includes a hash function circuit 100 configured for generating a hash polynomial h(x) for the address of the data packet according to a user-specified hash function. The user-specified hash function, stored in a user-programmable register (HASHPOLY) 74a, includes a 12-bit value defining the hash polynomial used by the hash function circuit 100, described in detail below. The hash polynomial output by the hash function circuit 100 is output to a logic circuit, for example a 12-bit parallel AND gate, that selectively outputs the lower significant bits of the hash-generated polynomial based upon a polynomial enable value (POLYEN) stored in register 74b. The field "POLYEN" defines how many bits of the hash polynomial are used to create the bin number, and preferably having a maximum value of seven (7). For example, if POLYEN =5, then the multiport switch uses the lower 5 bits of the output of the hash key (i.e., h(address)) after hashing on the address. Hence, the hash key output by the logic circuit 102 is based upon masking the 12-bit hash-generated polynomial output by the hash function circuit 100 using the stored register value POLYEN in register 74b to obtain a hash key having a prescribed number of bits corresponding to the number of bin entries, described below.

As shown in FIG. 3, the hash function circuit 100 and the logic circuit 102 are separate from the internal rules checker 68. The hash function circuit 100 and the logic circuit 102 may be implemented separately within the multiport switch 12, or may be incorporated within the functionality of each MAC port 60 or 62. Alternatively, the hash function circuit 100 and the logic 102 may be incorporated as part of the internal rules checker 68. Moreover, it will be appreciated that the programmable hashing described herein may be applied to the external rules checker 44, as desired.

As shown in FIG. 3, the internal rules checker 68 includes an internal controller 104 and a network address table 106.

As described above, the internal rules checker 68 or the external rules checker serves as the switching logic of the switching subsystem 70. Switching logic includes switching logic data that specifies the output port (or output ports) for the received data frame. The network address table 106 includes address entries for both source addresses and destination addresses, along with VLAN associations and forwarding port vectors. The controller 104 accesses the address table 106 based upon the supplied hash key from the logic circuit 102 in order to obtain the necessary information to make a forwarding decision based upon the source address, receive port, destination address, and VLAN associations. Once the necessary forwarding information has been obtained, the controller 104 outputs a port vector to the switch subsystem 70, which outputs the received data packet to the appropriate ports based upon the information in the port vector.

Figure 4:
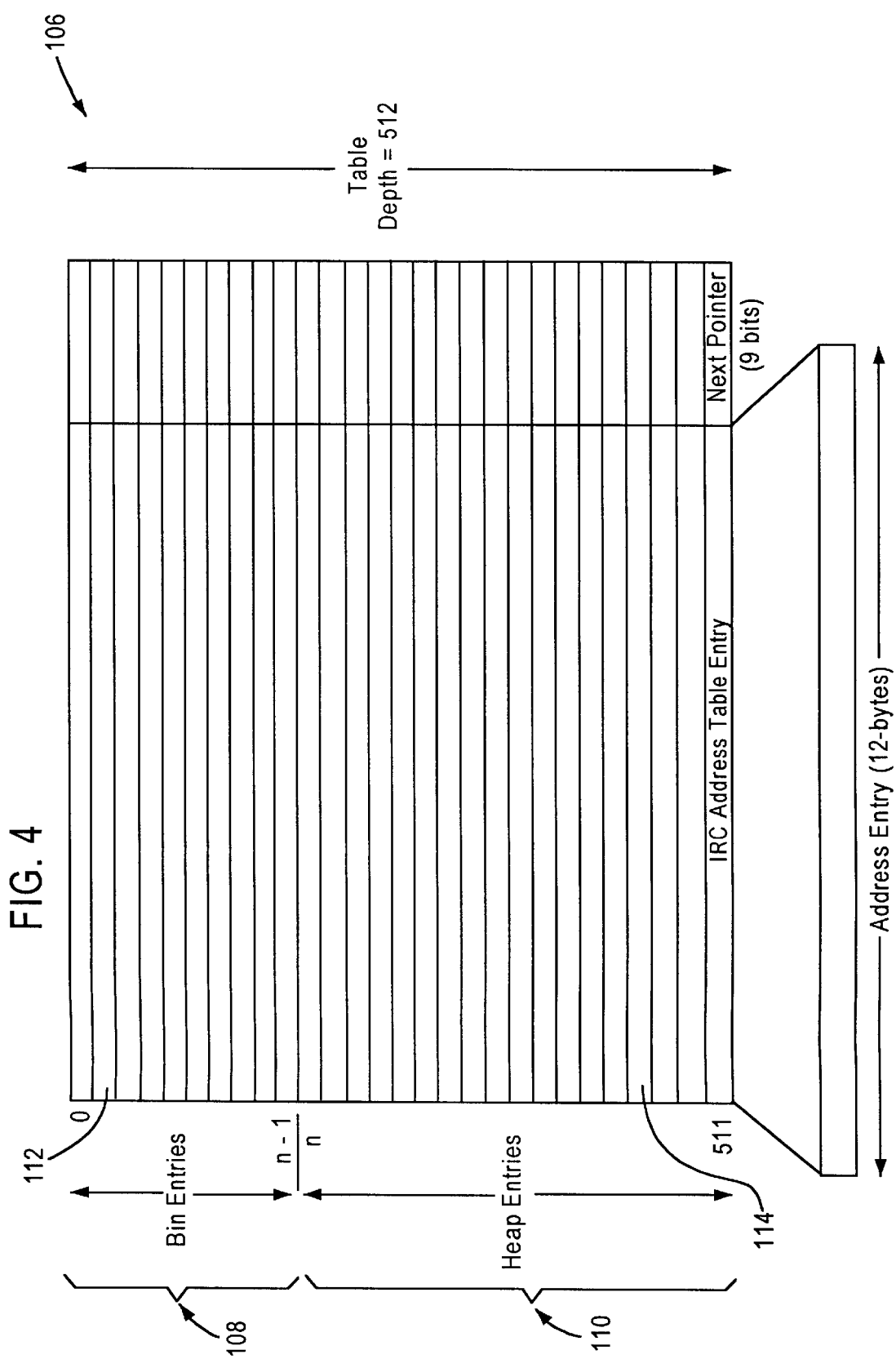
FIG. 4 is a diagram illustrating in detail the address table of FIG. 3.

FIG. 4 is a diagram illustrating the address table 106 of FIG. 3. The address table 106 is organized as a 105 bit×512 row memory with five hundred twelve (512) address entries. The address table 106 includes a first addressable range 108 of bin entries, and a second addressable range 110 of heap entries. The memory structure of FIG. 4 provides an indexed arrangement, where a given network address will be assigned to a corresponding bin. In other words, each bin entry 112 is configured to reference a plurality of table entries (i.e., heap entries) 114. Hence, the controller 104 performs a search of the address table 106 by first accessing a specific bin 112 pointed to by the hash key, and then searching the entries within (i.e., referenced by) the corresponding bin to locate the appropriate address.

Each bin entry 112 is the starting point for the search by the IRC controller 104 for a particular address within the address table 106. A bin entry may reference no addresses (i.e., be empty), may reference only one address within the bin entry location, or may reference a plurality of addresses using a linked list chain structure. Specifically, if a bin 112 references a plurality of addresses, unused entries in range 110 are used to link to the bin entry.

Figure 5:
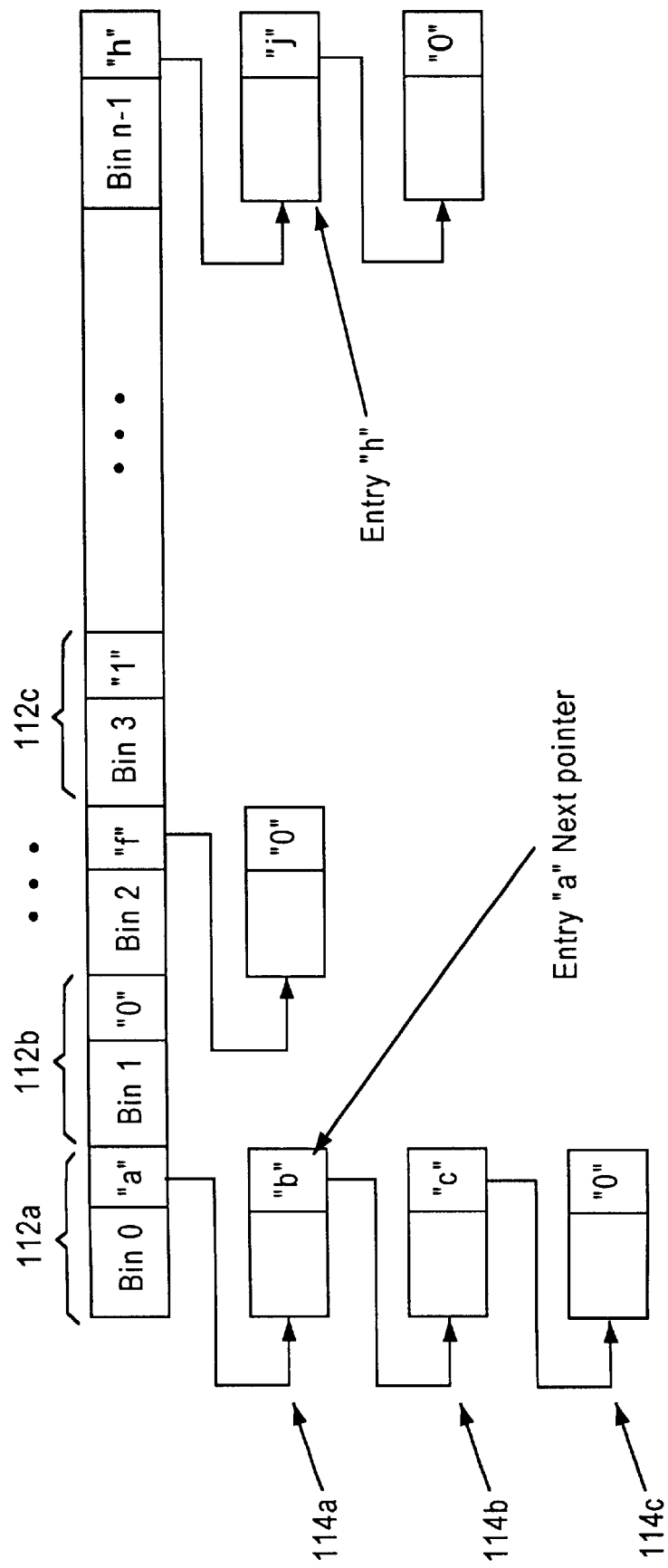
FIG. 5 is a diagram illustrating link list chains for identifying table entries relative to a selected bin.

FIG. 5 is a diagram illustrating bin entries referencing a different number of table entries. Each of the entries 112 and 114 includes a 12-byte address field and a 9-bit "next pointer" field. The "next pointer" field associated with the bin entry 112 identifies the location of the next entry in the chain of linked list addresses. For example, Bin 3 112c of FIG. 5 does not have any associated table entries. In such a case, the 12-byte address entry equals zero (or another null value), and the bin's corresponding "next pointer" field will have a value of "1", indicating no entries for the corresponding bin. If a bin such as Bin 1 112b contains a single table entry, the bin entry will store the switching logic data for that single address in its address entry field, and store the value "zero" in the "next pointer" field, indicating there are no further address entries in the chain. Bin 0 112a, however, references four addresses by using the "next pointer" field to identify the location of the next entry in the chain. The additional entries 114b and 114c in the bin are linked in no particular order into a linear list, as shown in FIG. 5. Thus, the first entry of Bin 0 is stored in the address entry field of the bin entry 112a and the next entry (heap entry 114a) is referenced by address entry "a" in the next pointer field of the bin entry 2a.

As described above, it is desirable to provide an even distribution of incoming network addresses across the available bin entries. Depending upon the number of bins that are programmed by the value POLYEN in register 74b, there will be a distribution of addresses across all the bins, such that the number of addresses in each bin is generally uniform, enabling the amount of time required to search for a specific address field to be controlled to a finite value. For example, if each bin had fifteen entries, then the IRC controller 104 would only need to search A the fifteen entries of a bin, as opposed to searching for 512 or 4096 entries, where the bin is identified based upon the corresponding hash key.

However, different hash functions may generate different distribution results, causing certain hash functions to map more addresses to one bin than another bin, depending upon the nature of the network addresses. Hence, certain hash function values may be inappropriate for a certain set of network addresses.

The disclosed embodiment enables monitoring of the number of table entries for a given bin, such that the hash function circuit 100 is selectively reprogrammed by rewriting the HASHPOLY value in register 74a with another value specifying another user-specified hash function. Specifically, the host 40 of FIG. 3 includes a host processor 120 that monitors the number of table entries for each bin. The host 40 also includes a nonvolatile memory 122 that stores a plurality of hash configuration values specifying respective available hash functions. The host processor 120 monitors the bin entries for the number of corresponding table entries, and selectively reprograms the HASHPOLY value stored in register 74a with another one of the available hash function values stored in registers 122a, 122b, 122c, etc. in response to the number of table entries exceeding a prescribed threshold.

The programmable hash polynomial is based upon a 12-bit value representing the coefficients of a $12^{th}$ order polynomial. Hence, the HASHPOLY register value of "0000 1001 1001" (loaded from host memory 122a) corresponds to the hash polynomial $h(x)=x^{12}+x^7+x^4+x^3+1$, the HASHPOLY register value of "0000 0101 0011" (loaded from host memory 122b) corresponds to the hash polynomial $h(x)=x^{12}+x^6+x^4+x+1$, and the HASHPOLY register value of "0001 0011 0001" (loaded from host memory 122c) corresponds to the hash polynomial $h(x)=x^{12}+x^8+x^6+x^5+1$. The term $x^{12}$ is assumed to always equal "1," and hence is not stored in the HASHPOLY register. These hash polynomials are preferred because they are primitive polynomials, although other polynomials may be used for the hash polynomial.

Hence, the host processor 120 monitors the structure of the address table 106, and determines the number of table entries 114 for a given bin entry 112. If the number of entries in any bin exceeds a prescribed threshold (e.g., sixteen table entries in a bin), the processor 120 could reprogram the HASHPOLY register 74a with a new hash polynomial.

Figure 6:
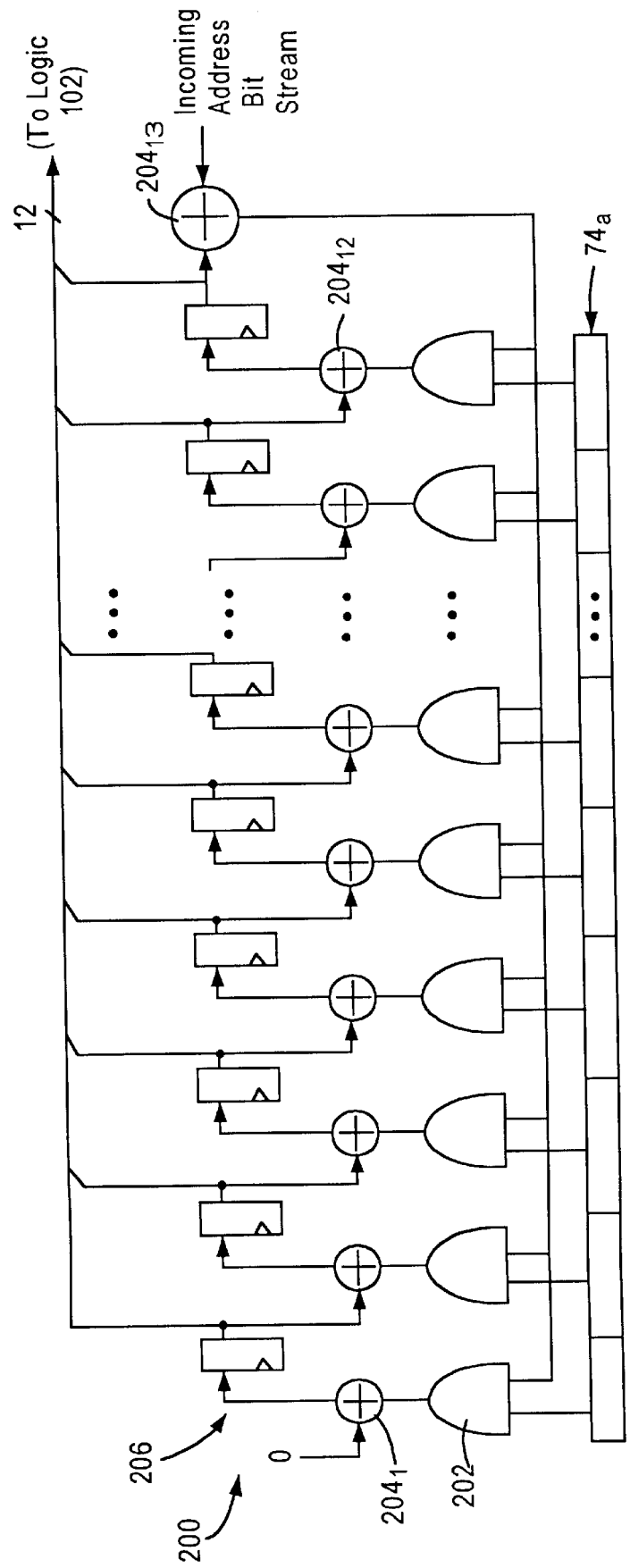
FIG. 6 is a diagram illustrating the hash function circuit of FIG. 3.

FIG. 6 is a block diagram illustrating a hash polynomial generator 100 as a serial hardware implementation of the programmable hash polynomial h(x). It will be recognized in the art that a similar parallel hardware implementation may be used for the programmable hash polynomial h(x). The hash polynomial generator 100 includes a series of AND gates 202, a series of exclusive OR gates (XOR) 204, and a shift register 206.

The hash polynomial generator 100 is configured by the programmable hash polynomial h(x) by receiving the bit-by-bit outputs from the HASHPOLY register 74a. Hence, each bit of the HASHPOLY register 74a drives a corresponding AND gate 202, such that a bit having a value of "1" in the HASHPOLY register 74a sets the output of the corresponding AND gate 202 equal to the bit stream value output from the XOR gate $204_{13}$.

The host 40 or management entity then programs the number of bins by setting a field "POLYEN" within a hash function configuration register 74b. The field POLYEN specifies the addressable bin range, and hence can be used as a mask for the hash polynomial to generate the appropriate hash key. Hence, the multiport switch will use only the lowest bits of the 12-bit hash function output to identify the bin. The selected bin will fall within the range of bins [0, N−1], where $N=2^{POLYEN}$.

Hence, the host reprograms the hash key periodically by reprogramming the hash function register 74a. The host processor 120 reprograms the hash key by clearing the address table. The host processor 120 then changes the hash function by reprogramming the hash function register 100, and then allows the internal rules checker to relearn the addresses into new bin. Alternatively, the host can perform the new hash function in software, and load the address table with the new address table entries based on the new hash function.

Hence, the disclosed embodiment enables the hash function to be programmable on a network by network basis. The host can reprogram the HASHPOLY register 74a by storing a set of preferred hash polynomials, and selecting a new polynomial from the set of preferred hash polynomials in response to detecting the number of entries in a bin exceeding the prescribed threshold. Hence, the disclosed arrangement enables the hash key generation to be optimized for different network configurations.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. A method for determining a network switch output port for transmission of a data packet having an address and having been received by a network switch, comprising:

storing a user-selected hash function in a programmable register;

generating a hash key for the received data packet in response to the user-selected hash function and the corresponding address;

accessing a selected bin entry from a plurality of bin entries in an address table based on the hash key, each bin entry configured to reference a corresponding plurality of table entries, each table entry configured for identifying the output port for a corresponding address; and determining the output port from one of the table entries of the selected bin entry based on the address.

2. The method of claim 1, wherein the storing step comprises storing a bit pattern in the programmable register, each bit of the bit pattern corresponding to a coefficient of a corresponding polynomial value.

3. The method of claim 2, wherein the generating step comprises supplying the address as a bit stream to a hash function circuit responsive to the bit pattern, the hash function circuit outputting a hash-generated polynomial.

4. A method for determining a network switch output port for transmission of a data packet having an address and having been received by a network switch, comprising:

storing a user-selected hash function in a programmable register;

generating a hash key for the received data packet in response to the user selected hash function and the corresponding address;

accessing a selected bin entry from a plurality of bin entries in an address table based on the hash key, each bin entry configured to reference a corresponding plurality of table entries, each table entry configured for identifying the output port for a corresponding address; and determining the output port from one of the table entries of the selected bin entry based on the address, wherein the storing step comprises storing a bit pattern in the programmable register, each bit of the bit pattern corresponding to a coefficient of a corresponding polynomial value, the generating step comprises supplying the address as a bit stream to a hash function circuit responsive to the bit pattern, the hash function circuit outputting a hash-generated polynomial, the storing step further comprises storing a polynomial enable value in a polynomial enable register, the polynomial enable value specifying a number of the bits in the hash key, and the generating step comprises generating the hash key in response to the hash-generated polynomial and the polynomial enable value.

5. The method of claim 4, wherein the polynomial value corresponds to an addressable range of the bin entries.

6. The method of claim 1, further comprising:

determining a number of table entries for at least one of the bin entries; and selectively storing a second user-selected hash function in the programmable register based on said number of table entries exceeding a prescribed value, the generating step generating a new hash key in response to the second user-selected hash function stored in the programmable register.

7. The method of claim 6, further comprising storing a plurality of available hash functions in a nonvolatile memory, the selectively storing step comprising loading one of the available hash functions into the programmable register.

8. The method of claim 1, wherein the storing step comprises:

storing a plurality of available hash functions in a nonvolatile memory; and selectively loading one of the available hash functions into the programmable register in response to the address table encountering a prescribed condition.

9. The method of claim 8, further comprising detecting as said prescribed condition the number of table entries for one of the bin entries exceeding a prescribed value.

10. The method of claim 1, further comprising:

clearing the address table;

storing a new user-selected hash function in the programmable register; and assigning a new table entry in the address table to a second selected bin entry in response to generating a second hash key for an address specified in the new table entry.

11. A method for controlling access of a network address table storing switching data for a plurality of network addresses, comprising:

storing a first number in a first programmable register, the first number specifying an addressable range of bin entries in the address table, each bin entry configured to reference a corresponding group of table entries for respective network addresses;

storing a second number specifying a user-specified hash function in a second programmable register, the hash function configured to map a network address value to one of the bin entries;

monitoring for at least one bin entry a number of the corresponding table entries; and replacing the second number in the second programmable register with a third number specifying a second user-specified hash function in response to the number of table entries exceeding a prescribed threshold.

12. The method of claim 11, wherein the replacing step comprises:

clearing the network address table;

selectively loading the third number from a plurality of stored available hash functions into the second programmable register; and loading the network address table with new table entries based on the a new hash fiction determined by said third number.

13. The method of claim 11, further comprising storing a plurality of the user-specified hash functions in a nonvolatile memory, the replacing step including selecting one of the user-specified hash functions as the second user-specified hash function.

14. The method of claim 11, wherein the replacing step comprises:

clearing the network address table;

selectively loading the third number from a plurality of stored available hash functions into the second programmable register; and causing a controller accessing the network address table using the hash function specified by the second programmable register to store learned addresses in the network address table.

15. A network switch configured for outputting a data packet having an address, comprising:

a first programmable register for storing a first number specifying an addressable range of bin entries;

a network address table for storing the addressable range of bin entries, each bin entry configured to reference at least one table entry and each table entry configured for storing switching data including an output port of the network switch for a corresponding address;

a second programmable register for storing a second number specifying a user-specified hash function;

a hash key generator configured to map the address of the data packet to one of the bin entries according to the user-specified hash function specified by the second number, the hash key generator outputting a hash key for addressing the one bin entry and having a number of bits based on the first number.

16. The network switch of claim 15, wherein the hash key generator comprises:

a hash function circuit configured for generating a hash-generated polynomial for the address of the data packet according to the user-specified hash function in response to the second number; and a logic circuit for outputting a portion of said hash-generated polynomial as said hash key in response to the first number.

17. The network switch of claim 15, wherein each bin entry is configured to reference a plurality of table entries using a link-list chain, wherein said each bin entry and each table entry includes a next-entry pointer segment, the next-entry pointer segment indicating one of another chain entry and an end-of-chain designation.

18. A system comprising:

a network switch configured for outputting a data packet having an address, comprising:
  (1) a first programmable register for storing a first number specifying an addressable range of bin entries,
  (2) a network address table for storing the addressable range of bin entries, each bin entry configured to reference at least one table entry and each table entry configured for storing switching data including an output port of the network switch for a corresponding address,
  (3) a second programmable register for storing a second number specifying a user-specified hash function, and
  (4) a hash key generator configured to map the address of the data packet to one of the bin entries according to the user-specified hash function specified by the second number, the hash key generator outputting a hash key for addressing the one bin entry and having a number of bits based on the first number; and a host processor configured for monitoring for at least one bin entry a number of the corresponding table entries, the host processor selectively reprogramming the second programmable register with a second number specifying another user-specified hash function in response to the number of table entries exceeding a prescribed threshold.

19. The system of claim 18, further comprising a non-volatile memory storing a plurality of hash configuration values specifying respective available hash functions, the host processor selectively storing one of the hash configuration values in said second programmable register as said second number in response to the number of table entries exceeding the prescribed threshold.

20. The system of claim 18, further comprising a memory controller configured for clearing the network address table in response to the reprogramming of at least one of the first and second programmable registers.

* * * * *